(12) United States Patent
Billenstein et al.

(10) Patent No.: US 6,500,012 B1
(45) Date of Patent: Dec. 31, 2002

(54) CONTACT SPRING STRIP FOR ATTACHING TO A HOLDING STRIP AND CONTACT PART WITH A CONTACT SPRING STRIP AND A HOLDING STRIP, ESPECIALLY A FRONT PANEL OF A PRINTED CIRCUIT MODULE

(75) Inventors: Ernst Billenstein, Burgbernheim (DE); Werner Körber, Betzenstein (DE); Siegfried Kurrer, Nürnberg (DE); Kurt-Michael Schaffer, Eckental (DE)

(73) Assignee: Rittal Electronic System GmbH & Co. KG, Herborn (DE)

( * ) Notice: Subject to any disclaimer, the term of this patent is extended or adjusted under 35 U.S.C. 154(b) by 0 days.

(21) Appl. No.: 09/831,221
(22) PCT Filed: Sep. 20, 1999
(86) PCT No.: PCT/DE99/03001
§ 371 (c)(1), (2), (4) Date: Oct. 29, 2001
(87) PCT Pub. No.: WO00/21349
PCT Pub. Date: Apr. 13, 2000

(30) Foreign Application Priority Data

Oct. 1, 1998 (DE) .................................. 298 17 537 U
Oct. 9, 1998 (DE) ..................................... 198 46 627

(51) Int. Cl.⁷ ................................................ H01R 4/66
(52) U.S. Cl. ........................... 439/92; 439/939; 439/95; 439/862; 439/816; 439/818; 361/818; 174/35 R
(58) Field of Search ............................... 439/92, 94, 95, 439/862, 108, 816, 818, 552, 939; 361/818; 174/35 R

(56) References Cited

U.S. PATENT DOCUMENTS

| | | | |
|---|---|---|---|
| 4,631,641 A | | 12/1986 | Brombal et al. ............. 361/818 |
| 5,885,118 A | * | 3/1999 | Billenstein et al. ......... 361/818 |
| 5,934,915 A | * | 8/1999 | Henningsson et al. .... 174/35 R |
| 6,000,956 A | * | 12/1999 | Henningsson et al. ........ 439/95 |

FOREIGN PATENT DOCUMENTS

| | | |
|---|---|---|
| DE | 41 10 800 | 7/1992 |
| WO | 96/39017 | 12/1996 |

* cited by examiner

Primary Examiner—Tho D. Ta
(74) Attorney, Agent, or Firm—Pauley Petersen Kinne & Erickson

(57) ABSTRACT

A contact spring connector that contains a holding strip, from which a contact spring leaf and a clamping leaf alternatingly extend in rows. A contact spring leaf has a contact leg, which is spread away from the holding strip and is connected with the holding strip via a cap area. A clamping leaf has a clamping leg connected with the holding strip by spring bands and from which a clamping element is spread away from between the spring bands. The decoupling of the contact spring leaf from the clamping leaf in particular results in ruggedness in respect to mechanical effects.

16 Claims, 2 Drawing Sheets the drawing figures
CONTACT SPRING STRIP FOR ATTACHING TO A HOLDING STRIP AND CONTACT PART WITH A CONTACT SPRING STRIP AND A HOLDING STRIP, ESPECIALLY A FRONT PANEL OF A PRINTED CIRCUIT MODULE

BACKGROUND OF THE INVENTION

1. Field of the Invention

This invention relates to a contact spring connector for attaching components of and associated with plug-in printed circuit board assemblies.

1. Description of Related Art

A mounting rack is known from U.S. Pat. No. 4,631,641. It makes module location slots available in an interior, which can be equipped with pluggable or plug-in printed board assemblies, which can be placed vertically and parallel next to each other. Each printed circuit board has a front panel on a front, which, for achieving electromagnetic shielding, has strips on both linear sides, each of which projects toward the pluggable printed board assembly. One of the strips is used as a holding element for a contact socket connector, while the other strip is used as a counter-contact element for the contact socket connector located on the front panel of an adjoining printed circuit board. If the module location slots of one mounting rack are completely equipped with pluggable printed board assemblies, then the front panels of the pluggable printed board assemblies located next to each other completely cover the respective plug-in side of the mounting rack. The gaps between the front panels are completely shielded in an electromagnetically sealing manner by the contact socket connectors.

A module for being plugged into HF-sealed housings of electronic apparatus is taught by German Patent Reference DE 41 10 800 C1. The module also has a front panel with a U-shaped cross-sectional profile, wherein a socket connector, which has a plurality of spring elements following each other in a chain-like manner, is placed on one of the two linear strips on one side of the front panel. Here, a spring element has two identically embodied contact springs, each with one spring leaf, as well as a spring clamp with a clamping leaf. The spring elements extend from a common, flat rear leaf in such a way that the socket connector has an approximately U-shaped cross-sectional shape and can be pushed onto one of the two linear strips of the front panel in a clamping manner such that the rear leaf rests on the inside of the linear strip, the clamping leaves rest on the outside of the linear strip and the spring leaves are spread away from exterior of the latter.

Finally, a contact socket connector for plugging on holding strips, in particular on the front panels of shielded mounting racks and having a plurality of contact springs, which are connected in a chain-like manner, is known from PCT International Application WO 96/39017. Each contact spring contains a cap area, which extends around a head area of the holding strip, a spring leaf which, starting at the cap area on the front of the holding strip, spreads outward from a bent edge, and two latching claws which, starting at the cap area, are spread out on the front side of the holding strip at the bent edge and are relief-cut and lie on both sides next to the spring leaf. Each of the latching claws has a holding lug with a latching edge spread away and upward toward the head area. Finally, the contact socket connector has a holding leaf, which extends, starting in the cap area, to the back of the holding strip. At least one holding lug is cut out of the holding leaf and is spread away in the direction toward the rear of the holding strip.

Socket connectors used for contacting in the above mentioned applications must satisfy numerous demands and are subjected to different stresses, in particular mechanical type stresses. Besides the requirement of providing a contacting force which is as evenly strong and continuous as possible over the entire length of the contact socket connector, the mechanical resistance of the contact socket connector against external influences is often of particular importance. For one, the latching of the contact socket connector on a holding strip, or a linear strip of a front panel, must be possible without resulting damage. The contact socket connector must withstand any mechanical stresses.

The latter can occur when a pluggable printed board assembly having a front panel and contact socket connector is pushed into the assigned module location slot in a mounting rack, or is pulled out. The deformations occurring because of the frictional movement along an adjoining front panel of a pluggable printed board assembly positioned next to it must not cause permanent damage to the associated contact socket connector, either when it is being pushed in or pulled out.

Furthermore, a contact socket connector must also be designed so that no damages occur even if, for example, an adjoining pluggable printed board assembly equipped with projecting elements, for example electrical components, heat sinks, pointed pins, wires and many others, is pushed into or pulled out of a module location slot. If during movement of the pluggable printed board assembly the contact socket connector at the front panel of an adjoining stationary pluggable printed board assembly should be brushed by the elements conducted past it, then no damage can be caused to the contact socket connector, in particular when hooked by projecting elements.

SUMMARY OF THE INVENTION

One object of this invention is to provide a contact socket connector of the above mentioned type in such a way that neither flat nor pointed objects which are passed by the contact socket connector can cause damage. This object is achieved with a contact socket connector, the claims and specification of which describe advantageous embodiment forms of the contact socket connector and a contact element used as a support for the contact socket connector.

BRIEF DESCRIPTION OF THE DRAWINGS

This invention and its advantages are explained in view of an exemplary embodiment shown in the drawing figures wherein.

DESCRIPTION OF PREFERRED EMBODIMENTS

Figure 1:
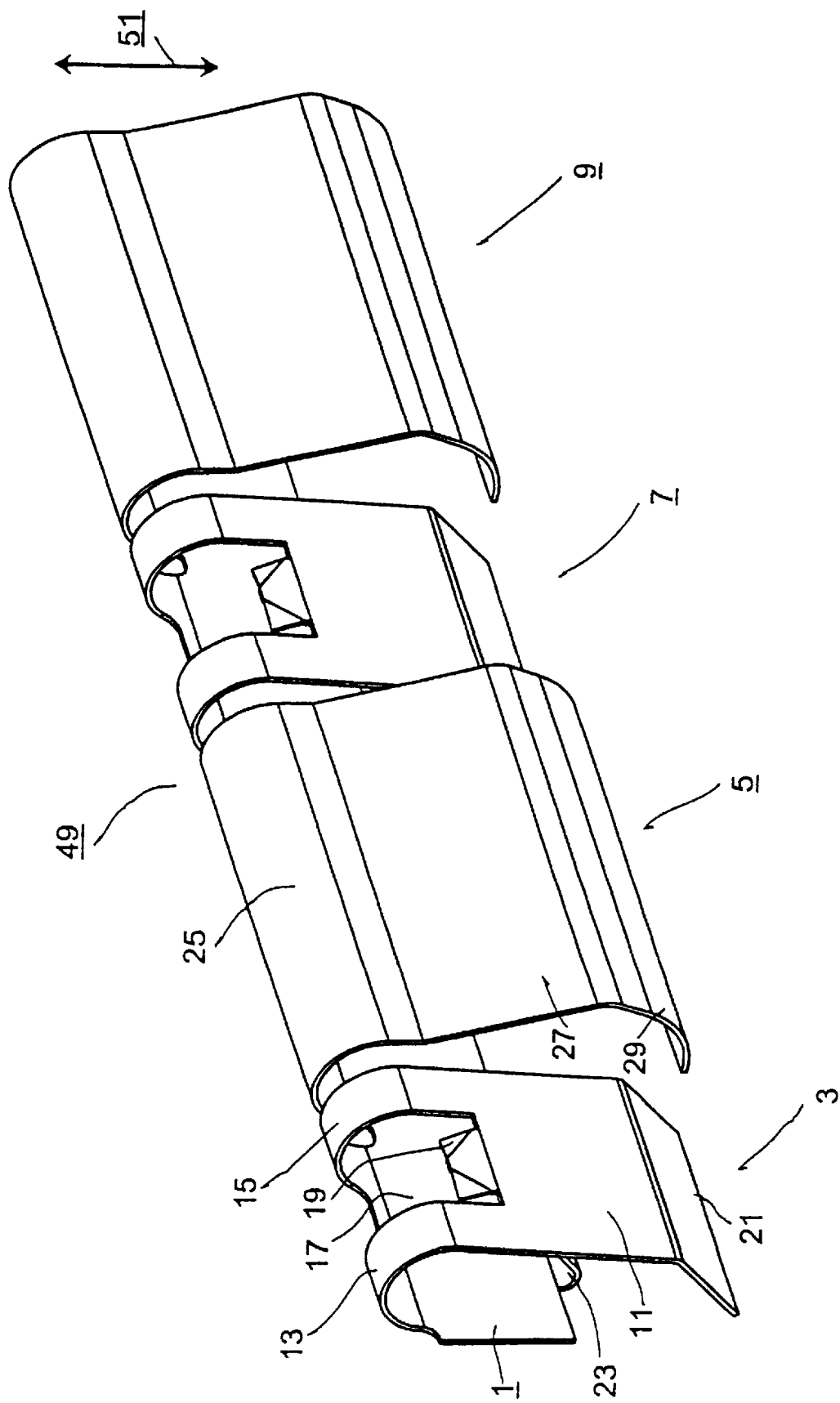
FIG. 1 is a perspective top view of a preferred embodiment of a contact socket connector, in accordance with this invention.

FIG. 1 shows a perspective top view of a segment of a preferred embodiment of a contact socket connector 49, in accordance with the invention, having a preferred flat holding strip 1, from which two pairs of respectively contact spring leaves 5 or 9, and a clamping leaf 3 or 7 branch off, shown by the segment in FIG. 1. In actuality, a contact socket connector has a considerably increased length in comparison with the segment shown in FIG. 1, wherein respectively contact spring leafs and a clamping leaf alternatingly branch off in rows from the holding strip 1. The structure of the contact socket connector is explained in greater detail by an example of the contact spring leaf 5 and the clamping leaf 3.

The contact spring leaf 5 essentially has a contact leg 27, which is spread away from the holding strip 1 and is connected with the holding strip 1 via a cap area 25, which is curved in an approximately U-shaped manner. The contact leg 27 forms the actual contacting area of the contact socket connector 49 because the contact leg 27 rests resiliently on the surface of an adjoining element, making an electrically conducting connection.

At an end 29 located opposite the cap area 25, and bent approximately U-shaped, the contact leg 27 is advantageously bent in a direction toward the holding strip 1. The compact design of the contact spring leaves of the contact socket connector 49 in accordance with this invention is insensitive to mechanical effects of any type. These act on the contact spring leaves in the tangential direction in particular, which is indicated by a two-headed arrow 51 in FIG. 1.

The clamping leaf 3, which represents the second type of the elements which are alternatingly lined up on the holding strip 1, has a clamping leg 11, which is connected with the holding strip 1 by means of two spring bands 13 and 15, which are bent in an approximately U-shaped manner. Finally, a clamping element 19 located between the spring bands 13 and 15 spreads away starting at the clamping leg 11. Support of the contact socket connector 49 is essentially provided by means of the clamping leaf 3 and its clamping element 19. The suspender-like connection of the clamping leg 11 on both sides by means of the two spring bands 13, 15 and the quasi symmetrical envelopment by the spring bands 13, 15 of the clamping element 19 located in the relief-cut 17 located between them, causes the support of the clamping leaf 3 on the holding strip 1 in a manner which is particularly rigid with respect to external mechanical effects.

The clamping element 19 is advantageously designed as a latching claw, which is spread away from the clamping leg 11 in the direction toward the holding strip 1. Such an embodiment is shown in FIG. 1 and can be seen particularly clearly in the cross-sectional representation of the contact socket connector in FIG. 2. The particularly secure support of the contact socket connector 49 on a holding strip can be achieved by means of a latching claw 19, which is quasi spread away upward and inward, on which the contact socket connector 49 is clipped. This will be explained in greater detail as shown in FIG. 3.

Moreover, it is advantageous if the clamping leg 11 is inclined in the direction toward the holding strip 1. Thus the adhesion of the contact socket connector on a holding strip can be further improved. Such an embodiment has also already been illustrated in the example in FIG. 1 and can be seen particularly clearly in the cross-sectional representation of the contact socket connector in FIG. 2. Finally, it is advantageous if, on an end 21 located opposite the spring bands 13, 15, the clamping leg 11 is bent in the direction toward the holding strip 1.

Figure 3:
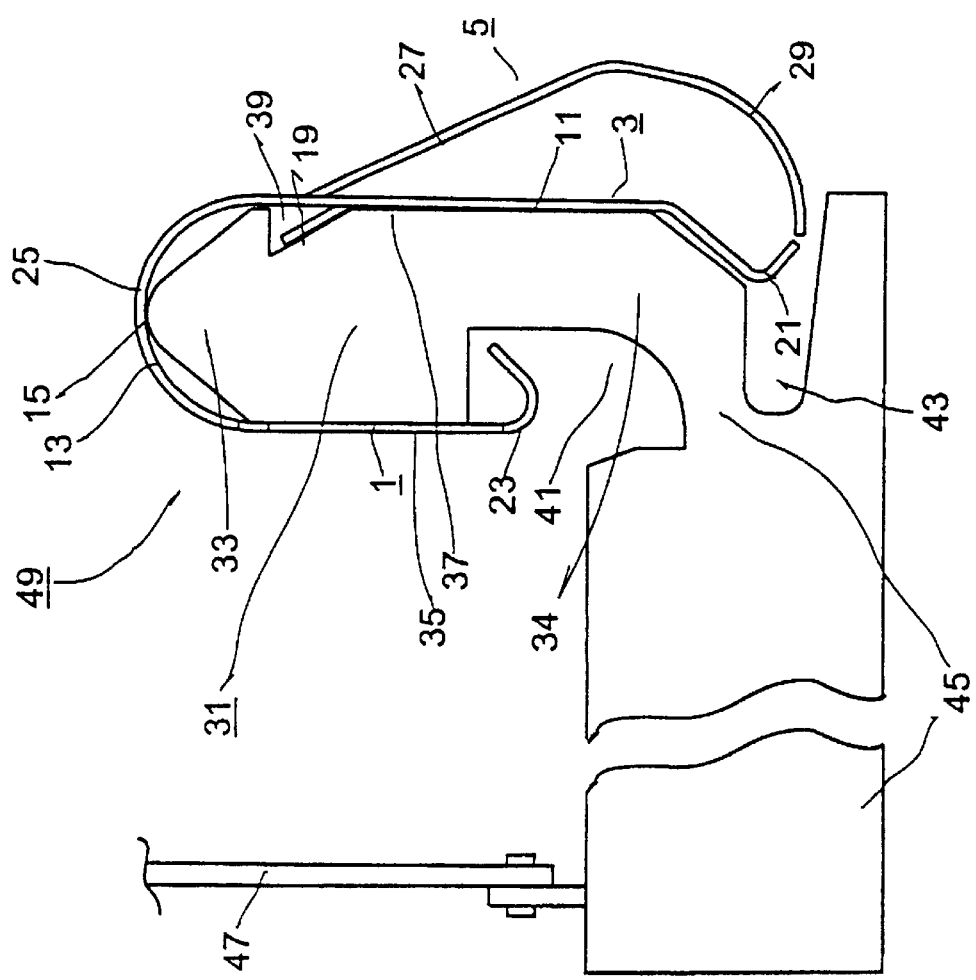
FIG. 3 is a cross-sectional view of the preferred embodiment of a contact element on which a contact socket connector in accordance with FIGS. 1 and 2 is latched.
Figure 2:
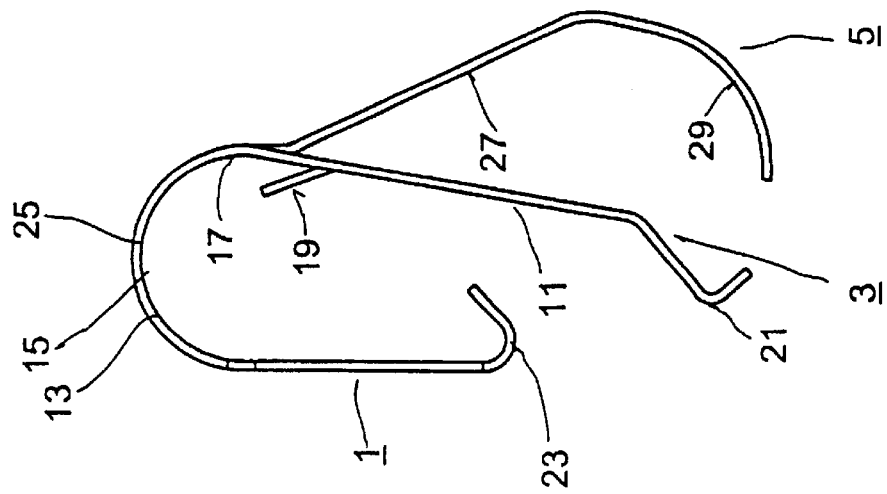
FIG. 2 is a cross-sectional view of the preferred embodiment of the contact socket connector in accordance with FIG. 1.

In accordance with one embodiment of a contact socket connector of this invention shown in FIGS. 1, 2 and 3, the holding strip 1 has a latching hook 23, which is bent off in the direction of an oppositely located contact spring leaf, or clamping leaf, on the end which is located opposite the place where a contact spring leaf 5 or 9, and a clamping leaf 3 or 7 branch off. Such an embodiment can be clearly seen in the cross-sectional view in FIG. 2. Thus it is possible to improve the support of the contact socket connector 49 on a holding strip, which is explained in greater detail in what follows by means of the example in FIG. 3.

With the design in accordance with this invention, of the clamping leaves and contact spring leaves of the contact socket connector, it is possible to prevent, when one of the adjoining pluggable printed board assemblies is pushed in or pulled out, catch points from projecting elements, for example electrical components, heat sinks, pointed pins, wires on the surface of adjoining pluggable printed board assemblies, during an inadvertent touching of the surface of a clamping leaf or contact spring leaf, which cause local deformations of the contact socket connector because of excessive use of force by the provoked operators.

The design in accordance with this invention of a contact socket connector 49 has a further advantage because it is particularly rugged due to the structural separation of the function of contacting from the function of clamping by means of separate contact spring leaves and clamping leaves separated from them. Thus, mechanical deformations of contact legs and cap areas of the contact spring leaves, which unavoidably occur during activating or deactivating the contact socket connector, have almost no effect on adjoining clamping leaves. The latter are almost completely mechanically uncoupled from the contact spring leaves, in particular because the approximately U-shaped curved pairs of spring bands of the clamping leaves and the approximately U-shaped curved cap areas of contact spring leaves are separated, and are thus separately conducted around a holding strip located underneath and are separately seated on the holding strip. The holding strip alone forms the element connecting all parts.

A portion of a contact element 45, which is used as a support for a contact socket connector 49, is shown in FIG. 3. For example, this contact element has the shape of a front panel of a pluggable printed board assembly 47 attached to it. As a rule, such a front panel has a flat front, from whose front faces holding strips extend backward on both sides. A holding strap 31 is present on the right front face of the example shown in FIG. 3, on which a contact socket connector 49 of the type described above has been clipped. Here, the U-shaped cap area 25 of the contact spring leaf 5 and the U-shaped spring bands 13, 15 enclose the head area 33 of the holding strap 31. Furthermore, the holding strip 1 rests on an inside 35, and in particular the clamping leg 11 of the clamping leaf 3 on an outside 37 of the holding strap 31. A clamping effect is generated during this by the inclination of the clamping leg 11 in the direction toward the holding strip 1, shown in FIG. 2, where the contact socket connector 49 is not clipped on. The contact leg 27 of the contact spring leaf 5 is spread away from the right outside 37 of the holding strap 31, which is clearly visible in FIG. 3.

In the example in FIG. 3, the clamping element 19 acts clampingly on the outside 37 of the holding strap 31 in its head area 33. It is advantageous if the holding strap 31 of the contact element 45 in accordance with FIG. 3 has an additional first linear groove 39 approximately in the head area 33, into which the at least one clamping element 19 can snap.

In accordance with a further embodiment, also shown in FIG. 3, the holding strap 31 of the exemplary contact element has a second linear groove 43 approximately in a base area 34 on the outside 37 for the insertion of bent-off ends 21 or 29 of clamping legs 11 and contact legs 27. The pivoting of the ends into this groove prevents the ends from acting as catch points or impact edges and from representing a cause for damage of the contact socket connector.

Finally, the holding strap 31 of the exemplary contact element has, in accordance with a further embodiment as shown in FIG. 3, a third linear groove 41 approximately in a base area 34 on the inside 35 for the engagement of bent-off latching hooks 23 at the lower end of the holding strip 1. It is thus possible to further improve the clamping effect of the contact socket connector 49 on the holding strap 31 of the contact element 45.

What is claimed is:

1. In a contact socket connector (49) for clipping on a holding strap (31), in particular a front panel (45) of a pluggable printed board assembly (47), the improvement comprising:

a holding strip (1), from which respectively a contact spring leaf (5, 9) and a clamping leaf (3, 7) alternatingly extend in a row-like manner, the contact spring leaf (5, 9) having a contact leg (27) spreading away from the holding strip (1) and connected via an approximately U-shaped curved cap area (25) with the holding strip (1), and the clamping leaf (3, 7) having a clamping leg (11) connected via two approximately U-shaped curved spring bands (13, 15) with the holding strip (1) and from which a clamping element (19) is spread away between the spring bands (13, 15).

2. In the contact socket connector in accordance with claim 1, wherein the clamping leg (11) is inclined in a direction toward the holding strip (1).

3. In the contact socket connector in accordance with claim 1, wherein the clamping leg (11) is bent off in a direction toward the holding strip (1) at an end (21) located opposite the spring bands (13, 15).

4. In the contact socket connector in accordance with claim 1, wherein the contact leg (27) is bent off in the direction toward the holding strip (1) at an end (29) located opposite the U-shaped curved cap area (25).

5. In the contact socket connector in accordance with claim 1, wherein the holding strip (1) has a latching hook (23) bent off toward one of the contact spring leaf and the clamping leaf at an end portion located opposite a place where one of the contact spring leaf (5, 9) and the clamping leaf (3, 7) branch off.

6. In the contact socket connector in accordance with claim 1, wherein the clamping element (19) is formed as a latching claw spread away from the clamping leg (11) in a direction toward the holding strip (1).

7. In the contact socket connector in accordance with claim 6, wherein the clamping leg (11) is inclined in the direction toward the holding strip (1).

8. In the contact socket connector in accordance with claim 7, wherein the clamping leg (11) is bent off in the direction toward the holding strip (1) at an end (21) located opposite the spring bands (13, 15).

9. In the contact socket connector in accordance with claim 8, wherein the contact leg (27) is bent off in the direction toward the holding strip (1) at an end (29) located opposite the U-shaped curved cap area (25).

10. In the contact socket connector in accordance with claim 9, wherein the front panel (45) on the pluggable printed board assembly (47), having the holding strap (31) and a contact socket connector (49), which is slipped on the contact socket connector (49), wherein the holding strap (31) has a second linear groove (43) approximately in a base area (34) for engagement of a bent-off end (21, 29) of at least one of the clamping leg (11) and the contact leg (27).

11. In the contact socket connector in accordance with claim 9, wherein the holding strip (1) has a latching hook (23) bent off toward one of the contact spring leaf and the clamping leaf at an end portion located opposite a place where one of the contact spring leaf (5, 9) a nd the clamping leaf (3, 7) branch off.

12. In the contact socket connector in accordance with claim 11, wherein the front panel (45) on the pluggable printed board assembly (47), has the holding strap (31) and the contact socket connector (49), which can be slipped on the contact socket connector (49), wherein the holding strap (31) has a third linear groove (41) approximately in a base area (34) for engagement of the bent-off latching hook (23) of the holding strip (1).

13. In the contact socket connector in accordance with claim 11, wherein a front panel (45) on a pluggable printed board assembly (47), having a holding strap (31) and a contact socket connector (49), is slipped on the contact socket connector (49).

14. In the contact socket connector in accordance with claim 13, wherein the holding strap (31) has a first linear groove (39) approximately in a head area (33) for engagement of at least one clamping element (19).

15. In the contact socket connector in accordance with claim 8, wherein the front panel (45) on the pluggable printed board assembly (47), having the holding strap (31) and the contact socket connector (49), which is slipped on the contact socket connector (49), wherein the holding strap (31) has a second linear groove (43) approximately in a base area (34) for engagement of a bent-off end (21, 29) of at least one of the clamping leg (11) and the contact leg (27).

16. In the contact socket connector in accordance with claim 15, wherein the front panel (45) on the pluggable printed board assembly (47), has the holding strap (31) and the contact socket connector (49), which can be slipped on the contact socket connector (49), wherein the holding strap (31) has a third linear groove (41) approximately in a base area (34) for engagement of a bent-off latching hook (23) of the holding strip (1).

* * * * *